(12) United States Patent (10) Patent No.: US 12,666,877 B2
Yamada et al. (45) Date of Patent: Jun. 23, 2026

(54) PIEZOELECTRIC DEVICE

(71) Applicant: SEIKO EPSON CORPORATION, Tokyo (JP)

(72) Inventors: Masayoshi Yamada, Chino (JP); Eiji Osawa, Matsumoto (JP)

(73) Assignee: SEIKO EPSON CORPORATION (JP)

( * ) Notice: Subject to any disclaimer, the term of this patent is extended or adjusted under 35 U.S.C. 154(b) by 882 days.

(21) Appl. No.: 17/989,754

(22) Filed: Nov. 18, 2022

(65) Prior Publication Data

US 2023/0165153 A1 May 25, 2023

(30) Foreign Application Priority Data

Nov. 19, 2021 (JP) ................................. 2021-188435

(51) Int. Cl.
*H10N 30/87* (2023.01)
*H10N 30/88* (2023.01)
(52) U.S. Cl.
CPC ......... *H10N 30/875* (2023.02); *H10N 30/872* (2023.02); *H10N 30/883* (2023.02)
(58) Field of Classification Search
CPC ...... H10N 30/02; H10N 30/05; H10N 30/057; H10N 30/06; H10N 30/063; H10N 30/07; H10N 30/071; H10N 30/072; H10N 30/101; H10N 30/50; H10N 30/501; H10N 30/802; H10N 30/87; H10N 30/872; H10N 30/875; H10N 30/88; H10N 30/883
See application file for complete search history.

(56) References Cited

U.S. PATENT DOCUMENTS

| | | | |
|---|---|---|---|
| 9,554,775 B2 * | 1/2017 | Nakamura | ............. H10N 30/01 |
| 11,453,031 B2 | 9/2022 | Suzuki et al. | |
| 11,910,720 B2 | 2/2024 | Osawa et al. | |

(Continued)

FOREIGN PATENT DOCUMENTS

| | | |
|---|---|---|
| CN | 111084637 A | 5/2020 |
| CN | 113054091 A | 6/2021 |
| JP | 2021-106183 A | 7/2021 |

*Primary Examiner* — Levi Gannon
(74) *Attorney, Agent, or Firm* — Harness, Dickey & Pierce, P.L.C.

(57) ABSTRACT

A piezoelectric device includes a first substrate including a first surface on which piezoelectric elements and a common terminal coupled to the piezoelectric elements are placed, a second substrate including a second surface on which a common connecting terminal coupled to a control circuit is placed, a third substrate placed between the first substrate and the second substrate and including a third surface joined to the first surface and a fourth surface facing the second surface, and bonding portions bonding the second substrate and the third substrate by an adhesive, wherein the third substrate includes a first through hole penetrating from the third surface to the fourth surface and a first through electrode provided in the first through hole and coupled to the common terminal, the common connecting terminal is coupled to the first through electrode and electrically coupled to the common terminal via the first through electrode, and the second substrate includes a wall suppressing an outflow of the adhesive on the second surface facing the third substrate.

4 Claims, 7 Drawing Sheets

(56)           References Cited

U.S. PATENT DOCUMENTS

| | | | |
|---|---|---|---|
| 2015/0085023 A1* | 3/2015 | Sakai | B41J 2/1646 |
| | | | 310/330 |
| 2016/0072039 A1* | 3/2016 | Iida | B41J 2/14233 |
| | | | 29/25.35 |
| 2016/0263890 A1* | 9/2016 | Hamaguchi | B41J 2/1629 |
| 2017/0028440 A1* | 2/2017 | Kiyose | H10N 30/073 |
| 2017/0225464 A1* | 8/2017 | Hirai | H10N 30/20 |
| 2020/0130014 A1 | 4/2020 | Suzuki et al. | |
| 2021/0202823 A1 | 7/2021 | Osawa et al. | |

* cited by examiner

*FIG. 5*

PIEZOELECTRIC DEVICE

The present application is based on, and claims priority from JP Application Serial Number 2021-188435, filed Nov. 19, 2021, the disclosure of which is hereby incorporated by reference herein in its entirety.

BACKGROUND

1. Technical Field

The present disclosure relates to a piezoelectric device.

2. Related Art

In related art, piezoelectric devices having piezoelectric elements arranged in matrix forms are known. For example, JP-A-2021-106183 discloses a piezoelectric device including a sealing plate having an opening portion, a vibrating plate closing the opening portion, and a piezoelectric element placed on the vibrating plate and sandwiching a piezoelectric material by an upper electrode and a lower electrode.

According to the disclosure, the vibrating plate and the sealing plate are placed to face each other. The sealing plate restricts the range of the vibration of the vibrating plate. The frequency of the vibration of the vibrating plate is set according to the size of the vibrating plate surrounded by the opening portion of the sealing plate.

A pair of through electrodes are placed in the sealing plate. The upper electrode and the lower electrode are respectively electrically continuous to the through electrodes. The sealing plate is placed to face a wiring board. The wiring board includes pads. The through electrodes project toward the wiring board. The pads and the through electrodes electrically contact. The upper electrode and the lower electrode are respectively electrically continuous to the pads.

The through electrodes are formed using resin adhesives containing metal fillers. The sealing plate and the wiring board are bonded using an insulating adhesive.

In the piezoelectric device of JP-A-2021-106183, the range of the adhesive spreading between the sealing plate and the wiring board varies. In this case, the bonding range of the sealing plate and the wiring board affects rigidity of the sealing plate. Further, the rigidity of the sealing plate affects vibration characteristics of the vibrating plate. Accordingly, the variations of the range of the adhesive spreading between the sealing plate and the wiring board change the resonance frequency of the piezoelectric element and the vibrating plate. On this account, a piezoelectric device that may suppress changes in resonance frequency due to the adhesive is desired.

SUMMARY

A piezoelectric device includes a first substrate including a first surface on which a plurality of piezoelectric elements and a first electrode coupled to the piezoelectric elements are placed, a second substrate including a second surface on which a second electrode coupled to a control circuit is placed, a third substrate placed between the first substrate and the second substrate and including a third surface joined to the first surface and a fourth surface facing the second surface, and a bonding portion bonding the second substrate and the third substrate, wherein the third substrate includes a through hole penetrating from the third surface to the fourth surface and a third electrode provided in the through hole and coupled to the first electrode, the second electrode is coupled to the third electrode and electrically coupled to the first electrode via the third electrode, and the second substrate includes a wall suppressing an outflow of an adhesive on the second surface facing the third substrate.

BRIEF DESCRIPTION OF THE DRAWINGS

FIG. 5 is a schematic side sectional view showing configurations of through electrodes.

DESCRIPTION OF EXEMPLARY EMBODIMENTS

First Embodiment

In the embodiment, a characteristic example of a piezoelectric device is explained.

Figure 1:
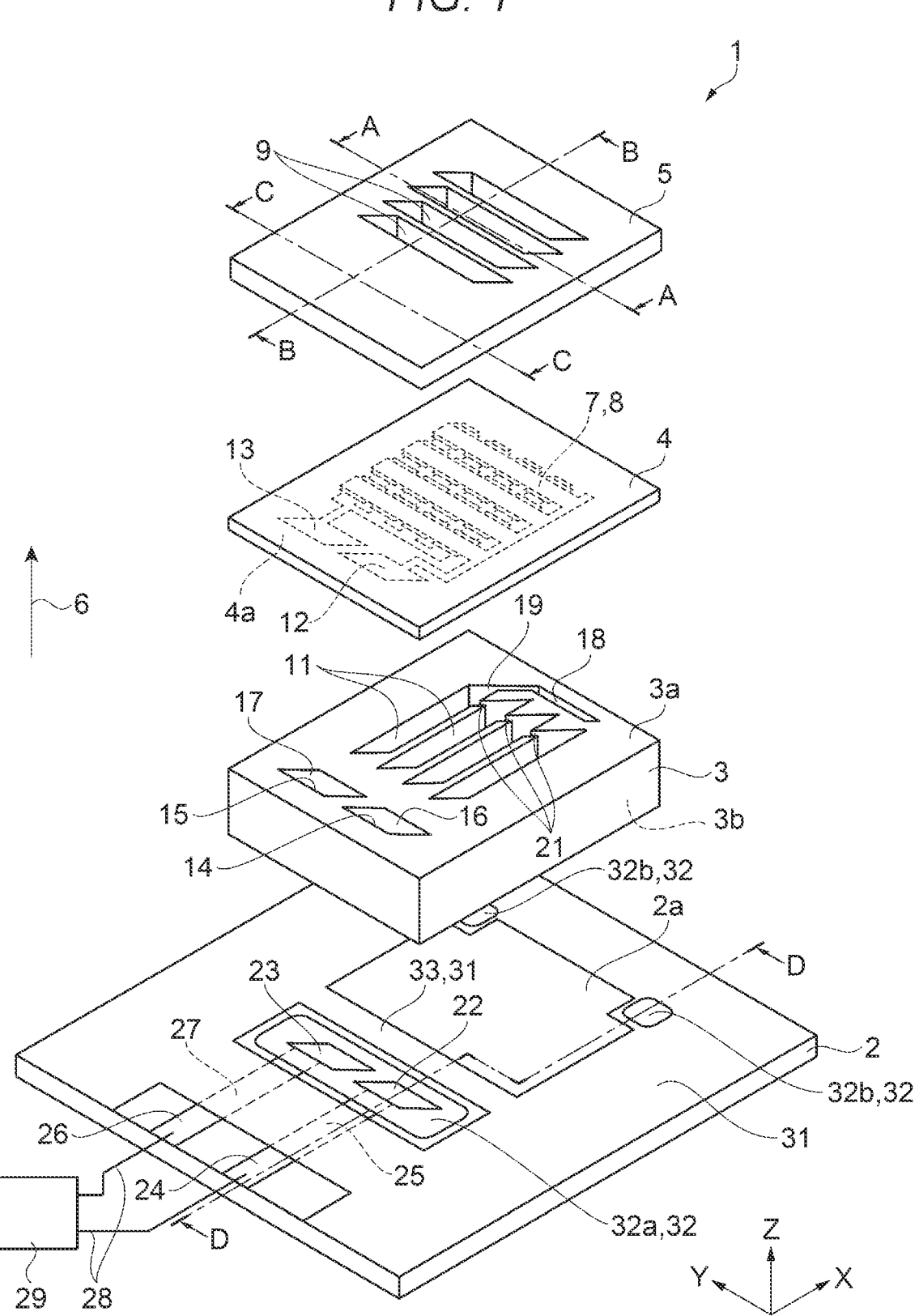
FIG. 1 is a schematic exploded perspective view showing a configuration of a piezoelectric device in a first embodiment.

As shown in FIG. 1, in a piezoelectric device 1, a second substrate 2, a third substrate 3, a first substrate 4, and a fourth substrate 5 are sequentially stacked in Z directions. In the Z directions, the fourth substrate 5 side is in the Z positive direction and the second substrate 2 side is in the Z negative direction. The direction along the Z positive direction is referred to as "first direction 6". The first direction 6 is the stacking direction of the first substrate 4, the third substrate 3, and the second substrate 2.

The second substrate 2, the third substrate 3, the first substrate 4, and the fourth substrate 5 have rectangular shapes as seen from the first direction 6. The longitudinal directions of the second substrate 2, the third substrate 3, the first substrate 4, and the fourth substrate 5 are the same. The third substrate 3, the first substrate 4, and the fourth substrate 5 have the same shape. The second substrate 2 is larger than the third substrate 3, the first substrate 4, and the fourth substrate 5.

The longitudinal directions of the second substrate 2 are X directions. The lateral directions of the second substrate 2 are Y directions. The X directions, the Y directions, and the Z directions are orthogonal to one another.

The first substrate 4 includes a first surface 4a at the side facing the third substrate 3. A plurality of piezoelectric elements 7 are arranged in a matrix form on the first surface 4a. Alternating-current voltages are applied to the piezoelectric elements 7, and thereby, the piezoelectric device 1 may vibrate the first substrate 4 and output ultrasonic wave. The first substrate 4 is also referred to as "vibrating plate". The plurality of piezoelectric elements 7 form an element array 8 in which the piezoelectric elements are arranged and placed.

The number of the piezoelectric elements 7 is not particularly limited. In the embodiment, for example, the piezoelectric elements 7 form an arrangement of four rows and four columns and the number of the piezoelectric elements 7 is 16.

The fourth substrate 5 includes four fourth holes 9 elongated in the Y directions. The shape of the fourth hole 9 is a parallelogram as seen from the first direction 6. The fourth substrate 5 is formed using a silicon single-crystal substrate. The fourth holes 9 are formed by wet-etching. The side surface of the fourth hole 9 is a crystal face with a lower etching rate. In the silicon single-crystal substrate, the crystal face with the lower etching rate has a parallelogram shape and the shape of the fourth hole 9 is the parallelogram. The fourth holes 9 penetrate the fourth substrate 5. The fourth holes 9 are placed in locations facing the arrangement of the piezoelectric elements 7. Note that the number of fourth holes 9 is not particularly limited.

The third substrate 3 is placed between the first substrate 4 and the second substrate 2. The third substrate 3 has a third surface 3a and a fourth surface 3b. The third surface 3a faces in the Z positive direction. The fourth surface 3b faces in the Z negative direction. The third surface 3a is joined to the first surface 4a of the first substrate 4. The third substrate 3 includes four second grooves 11 as sealing spaces elongated in the X directions in the third surface 3a. The shape of the second groove 11 as seen from the first direction 6 is a parallelogram. The third substrate 3 is formed using a silicon single-crystal substrate. The second grooves 11 are formed by wet-etching. Accordingly, the shape of the second groove 11 is the parallelogram. The second grooves 11 are placed in locations facing the arrangement of the piezoelectric elements 7.

The piezoelectric elements 7 are placed in locations where the fourth holes 9 and the second grooves 11 cross as seen from the first direction 6. Accordingly, the first substrate 4 may vibrate in the Z positive direction and the Z negative direction in the locations where the piezoelectric elements 7 are placed.

The first substrate 4 and the fourth substrate 5 are integrally provided. The material of the first substrate 4 is silicon oxide and the first substrate 4 is formed by oxidation of the fourth substrate 5.

On the first surface 4a of the first substrate 4, a common terminal 12 as a first electrode and a drive terminal 13 as a first electrode are placed. The common terminal 12 and the drive terminal 13 are electrically coupled to the piezoelectric elements 7.

The third substrate 3 has a first through hole 14 as a through hole penetrating from the third surface 3a to the fourth surface 3b in a position corresponding to the common terminal 12. The third substrate 3 has a second through hole 15 as a through hole penetrating from the third surface 3a to the fourth surface 3b in a position corresponding to the drive terminal 13. The thickness of the third substrate 3 is about 400 μm.

A first through electrode 16 as a third electrode is provided at the Z negative direction side of the common terminal 12 in the first through hole 14 of the third substrate 3. The first through electrode 16 is electrically continuous to the common terminal 12. A second through electrode 17 as a third electrode is provided at the Z negative direction side of the drive terminal 13 in the second through hole 15 of the third substrate 3. The second through electrode 17 is electrically continuous to the drive terminal 13.

The third substrate 3 includes an open hole 18 at the X positive direction side of the second grooves 11. The open hole 18 penetrates from the third surface 3a to the fourth surface 3b. The open hole 18 and the second grooves 11 are connected by a first communication groove 19. The four second grooves 11 are connected by second communication grooves 21 to one another.

The third substrate 3 and the first substrate 4 are bonded and fixed. The second grooves 11 are connected to the open hole 18, the first communication groove 19, and the second communication grooves 21 and not tightly closed. When the first substrate 4 vibrates, the air within the second grooves 11 communicates with the outside air and the air pressure is hard to fluctuate. Accordingly, the first substrate 4 easily vibrates.

The second substrate 2 includes a second surface 2a facing the fourth surface 3b of the third substrate 3. On the second surface 2a of the second substrate 2, a common connecting terminal 22 as a second electrode is placed in a location corresponding to the first through electrode 16. The common connecting terminal 22 is coupled to the first through electrode 16 and electrically coupled to the common terminal 12 via the first through electrode 16. On the second surface 2a of the second substrate 2, a drive connecting terminal 23 as a second electrode is placed in a location corresponding to the second through electrode 17. The drive connecting terminal 23 is coupled to the second through electrode 17 and electrically coupled to the drive terminal 13 via the second through electrode 17. Electric power is supplied to the common connecting terminal 22 and the drive connecting terminal 23, and thereby, the electric power may be supplied to the piezoelectric elements 7. The third substrate 3 and the second substrate 2 are flip-chip packaged.

The second substrate 2 includes an external common terminal 24 at the X negative direction side of the common connecting terminal 22. The external common terminal 24 and the common connecting terminal 22 are electrically coupled by a common connecting wire 25. The second substrate 2 includes an external drive terminal 26 at the X negative direction side of the drive connecting terminal 23. The external drive terminal 26 and the drive connecting terminal 23 are electrically coupled by a drive connecting wire 27.

The external common terminal 24 and the external drive terminal 26 are electrically coupled to a control circuit 29 by external wires 28. Therefore, the common connecting terminal 22 and the drive connecting terminal 23 are electrically coupled to the control circuit 29.

The common connecting wire 25 and the drive connecting wire 27 are covered by resists 31. The common connecting terminal 22, the drive connecting terminal 23, the external common terminal 24, and the external drive terminal 26 are exposed, not covered by the resists 31. The common connecting terminal 22 is electrically continuous to the first through electrode 16. The drive connecting terminal 23 is electrically continuous to the second through electrode 17.

The piezoelectric device 1 includes bonding portions 32 bonding the second substrate 2 and the third substrate 3 on the second surface 2a of the second substrate 2. The bonding portions 32 include a first bonding portion 32a and second bonding portions 32b. The second bonding portions 32b are placed on the second substrate 2 in locations overlapping with a corner at the Y positive direction side and a corner at the Y negative direction side at an end at the X positive direction side of the third substrate 3 as seen from the first direction 6. On the second substrate 2 corresponding to an end at the X negative direction side of the third substrate 3, the first bonding portion 32a is placed around the first through electrode 16 and the second through electrode 17. The common connecting terminal 22 and the drive connecting terminal 23 face the first through electrode 16 and the second through electrode 17, respectively. Therefore, the first bonding portion 32a is placed around the common connecting terminal 22 and the drive connecting terminal 23. The first bonding portion 32a and the second bonding portions 32b are apart, and thereby, bending of the third substrate 3 due to bonding is suppressed.

In an assembly process of the second substrate 2 and the third substrate 3, adhesives are applied to the locations where the bonding portions 32 are formed. The adhesives are applied to one of the second substrate 2 and the third substrate 3. The adhesives are sandwiched by the second substrate 2 and the third substrate 3. The first through electrode 16 and the common connecting terminal 22 are pressed against each other. The second through electrode 17 and the drive connecting terminal 23 are pressed against each other. The adhesives spread by pressure by the first through electrode 16, the second through electrode 17, the common connecting terminal 22, and the drive connecting terminal 23. The second substrate 2 includes a wall 33 suppressing an outflow of the adhesives on the second surface 2a facing the third substrate 3. The spread of the adhesives is suppressed by the wall 33. The adhesives are non-conductive. The non-conductive adhesive is called as NCP (Non-Conductive Paste). The adhesives are solidified to form the bonding portions 32.

According to the configuration, the second substrate 2 includes the wall 33. When the second substrate 2 and the third substrate 3 are bonded, the adhesives are applied to the second substrate 2. The outflow of the adhesives is suppressed by the wall 33. In the bonding portions 32, the second substrate 2 and the third substrate 3 are bonded and fixed by the adhesives. When the adhesives flow out to an area overlapping with the element array 8 in a plan view of the piezoelectric device 1, internal stress is generated in the third substrate 3 by bonding and affects the resonance frequency of the piezoelectric device 1. The wall 33 is placed, and thereby, the adhesives do not reach the area overlapping with the element array 8 in the plan view of the piezoelectric device 1. Therefore, the changes in resonance frequency due to the adhesives may be suppressed in the piezoelectric device 1.

The wall 33 is the resist 31. According to the configuration, the common connecting terminal 22 and the drive connecting terminal 23 are placed on the second substrate 2. The common connecting wire 25 connecting from the common connecting terminal 22 to the external common terminal 24 is coupled. The drive connecting wire 27 connecting from the drive connecting terminal 23 to the external drive terminal 26 is coupled. The common connecting wire 25 and the drive connecting wire 27 are coated with the resists 31. The wall 33 is the resist 31, and thereby, the wall 33 and the resists 31 as coating on the common connecting wire 25 and the drive connecting wire 27 may be formed at the same time. Therefore, the piezoelectric device 1 may be manufactured with higher productivity compared to a case where the wall 33 and the resists 31 for the common connecting wire 25 and the drive connecting wire 27 are formed in separate processes.

Figure 2:
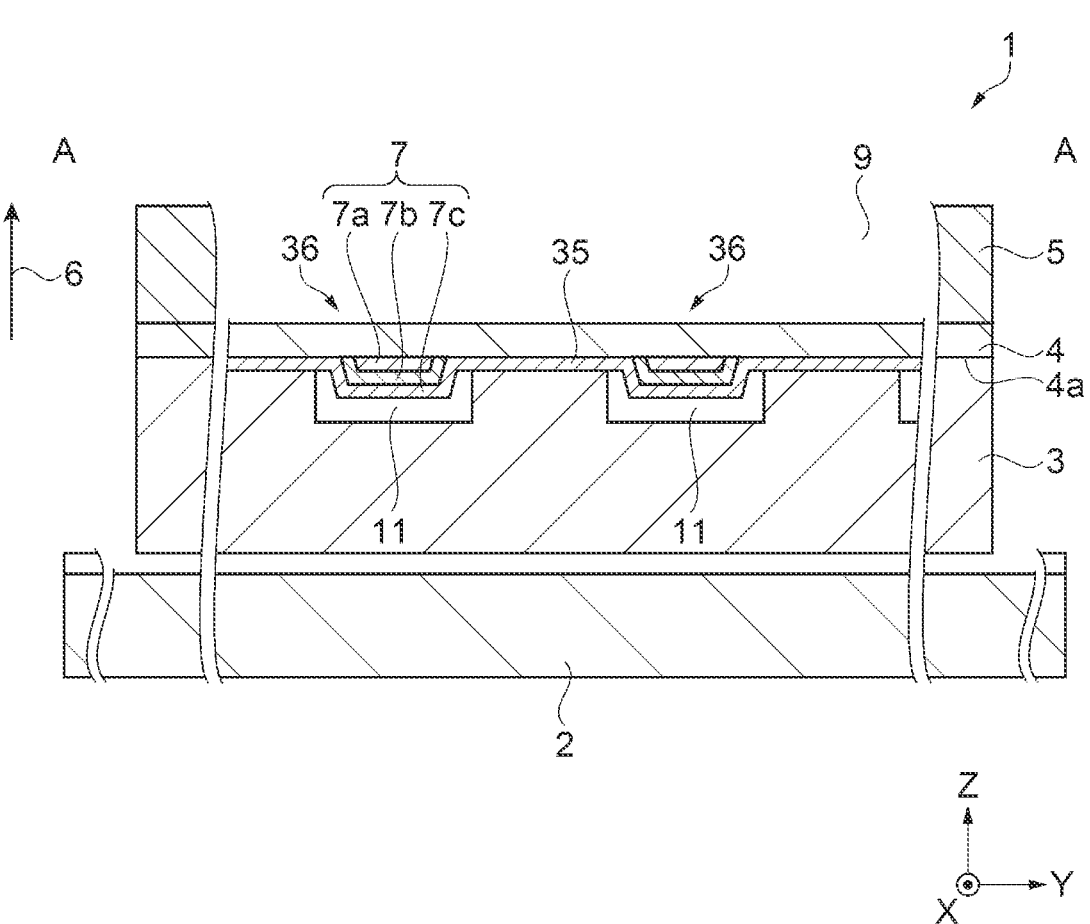
FIG. 2 is a schematic side sectional view showing the configuration of the piezoelectric device.
Figure 3:
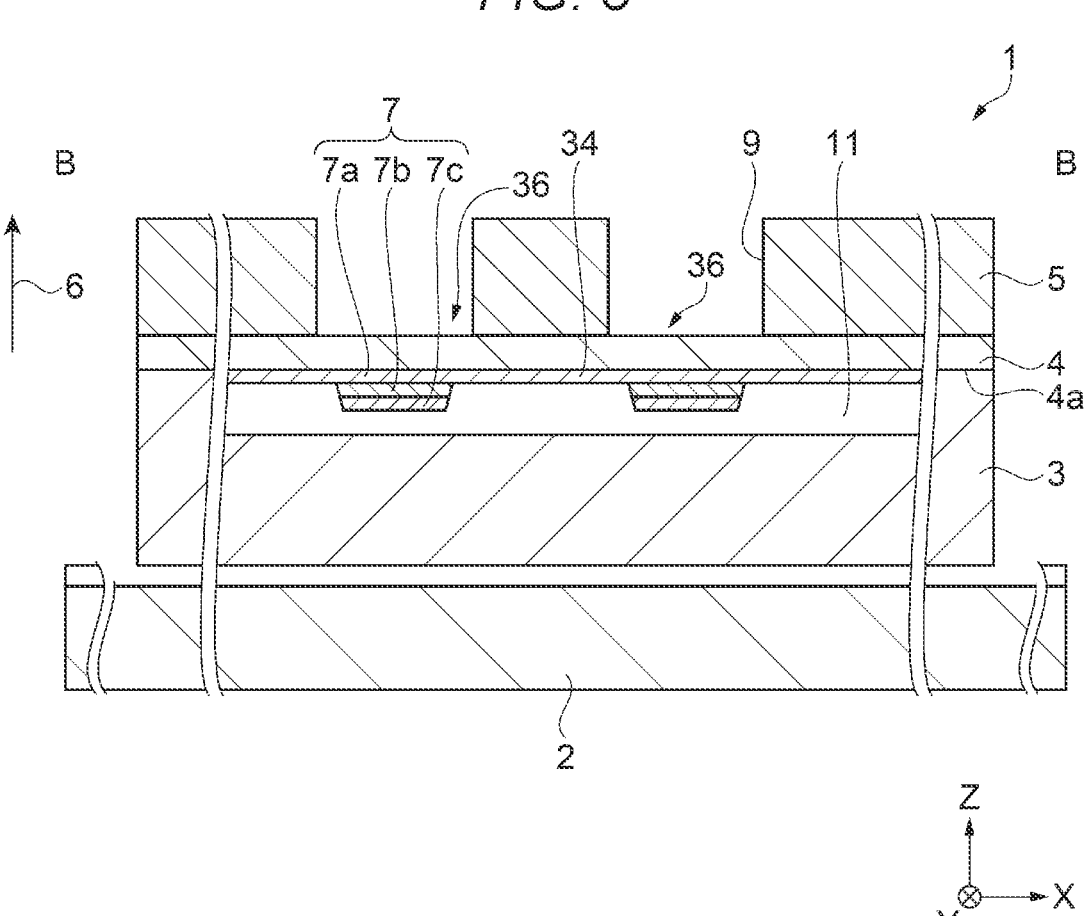
FIG. 3 is a schematic side sectional view showing the configuration of the piezoelectric device.

FIG. 2 shows a section along line AA in FIG. 1. FIG. 3 shows a section along line BB in FIG. 1. As shown in FIGS. 2 and 3, the piezoelectric elements 7 are placed in the locations where the fourth holes 9 and the second grooves 11 cross as seen from the first direction 6. The piezoelectric elements 7 are placed on the first surface 4a of the first substrate 4. The piezoelectric element 7 includes a drive electrode 7a, a piezoelectric film 7b, and a common electrode 7c placed to be stacked in the Z negative direction from the first surface 4a.

The piezoelectric film 7b is formed using e.g. transition metal oxide having a perovskite structure. Specifically, the piezoelectric film 7b is formed using lead zirconate titanate containing Pb, Ti, and Zr.

A plurality of the drive electrodes 7a are electrically continuous to drive wires 34 extending in the X directions. The drive electrodes 7a and the drive wires 34 are formed using the same material. A plurality of the common electrodes 7c are electrically continuous to common wires 35 extending in the Y directions. The common electrodes 7c and the common wires 35 are formed using the same material.

Ultrasonic transducers 36 are formed by the first substrate 4 and the piezoelectric elements 7. The drive electrodes 7a and the common electrodes 7c are electrically coupled to the control circuit 29. The common electrodes 7c are maintained at a predetermined reference potential. Drive pulse signals are input to the drive electrodes 7a, and the piezoelectric elements 7 are deformed and the first substrate 4 vibrates. Thereby, the ultrasonic transducers 36 transmit ultrasonic waves toward the Z positive direction side. When there is an object at the Z positive direction side of the piezoelectric device 1, the ultrasonic waves are reflected by the object. The reflected ultrasonic waves pass through the fourth holes 9 of the fourth substrate 5 and reach the ultrasonic transducers 36, and the first substrate 4 vibrates according to the sound pressure of the ultrasonic waves. The piezoelectric films 7b are deformed by the vibration of the first substrate 4 and potential differences are generated between the drive electrodes 7a and the common electrodes 7c. Thereby, reception signals according to the sound pressure of the received ultrasonic waves are output from the drive electrodes 7a of the ultrasonic transducer 36. That is, the ultrasonic waves are detected.

Figure 4:
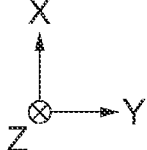
FIG. 4 is a schematic plan view showing a configuration of a first substrate.

FIG. 4 shows the first substrate 4 as seen from the third substrate 3 side. As shown in FIG. 4, the four drive wires 34 extending in the X directions are placed on the first surface 4a. The respective drive wires 34 are integrated at the X negative direction side and electrically coupled to the drive terminal 13. The four common wires 35 extending in the Y directions are placed on the first surface 4a. The respective common wires 35 are integrated at the Y negative direction side and electrically coupled to the common terminal 12.

An area where the element array 8 is placed is an array area 37. An area surrounding the array area 37 is a non-array area 38. The common terminal 12 and the drive terminal 13 are placed in the non-array area 38.

A signal output from the control circuit 29 to the external common terminal 24 passes through the common connecting wire 25, the common connecting terminal 22, the first through electrode 16, the common terminal 12, and the common wires 35 and is supplied to the common electrodes 7c. A signal output from the control circuit 29 to the external drive terminal 26 passes through the drive connecting wire 27, the drive connecting terminal 23, the second through electrode 17, the drive terminal 13, and the drive wires 34 and is supplied to the drive electrodes 7a. The control circuit 29 is electrically coupled to the piezoelectric elements 7. The control circuit 29 outputs drive signals to the piezoelectric elements 7.

Figure 5:
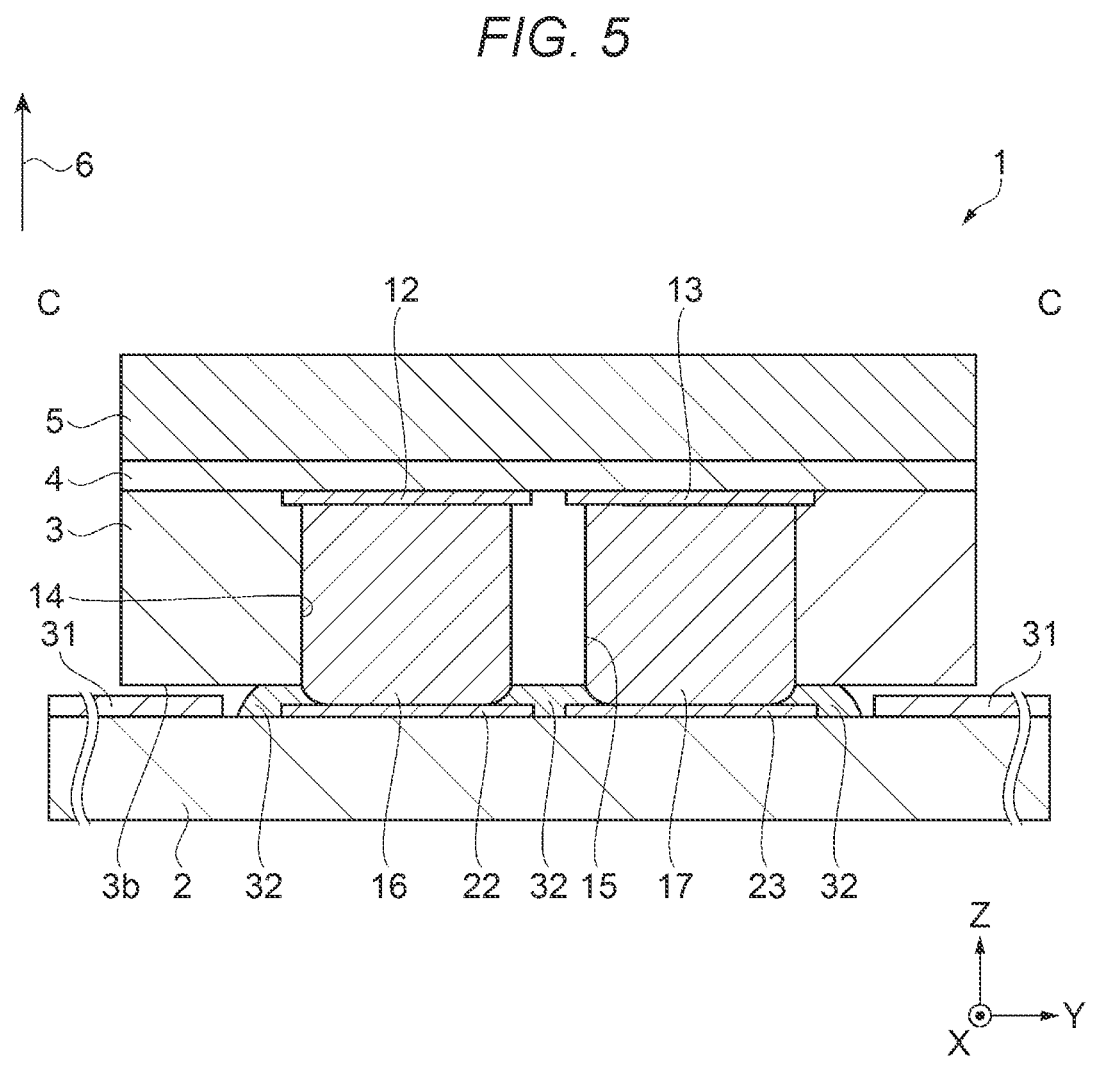

FIG. 5 shows a section along line CC in FIG. 1. As shown in FIG. 5, the first through electrode 16 electrically couples the common terminal 12 and the common connecting terminal 22. The second through electrode 17 electrically couples the drive terminal 13 and the drive connecting terminal 23.

The second substrate 2 is placed to face the fourth surface 3b of the third substrate 3. The second substrate 2 has the common connecting terminal 22 electrically continuous to the first through electrode 16. The second substrate 2 has the drive connecting terminal 23 electrically continuous to the second through electrode 17. The electric power is supplied to the common connecting terminal 22 and the drive connecting terminal 23, and thereby, the electric power is supplied to the piezoelectric elements 7.

The first through electrode 16 and the second through electrode 17 are formed using conductive resin adhesives solidified by heating and drying. Specifically, the first through electrode 16 and the second through electrode 17 are resins containing silver fillers. For the resin adhesives, e.g. epoxy resin, urethane resin, and silicone resin adhesives are used. Note that silver bumps may be formed on the common connecting terminal 22 and the drive connecting terminal 23. The adhesion between the first through electrode 16 and the common connecting terminal 22 may be increased. The adhesion between the second through electrode 17 and the drive connecting terminal 23 may be increased.

Figure 6:
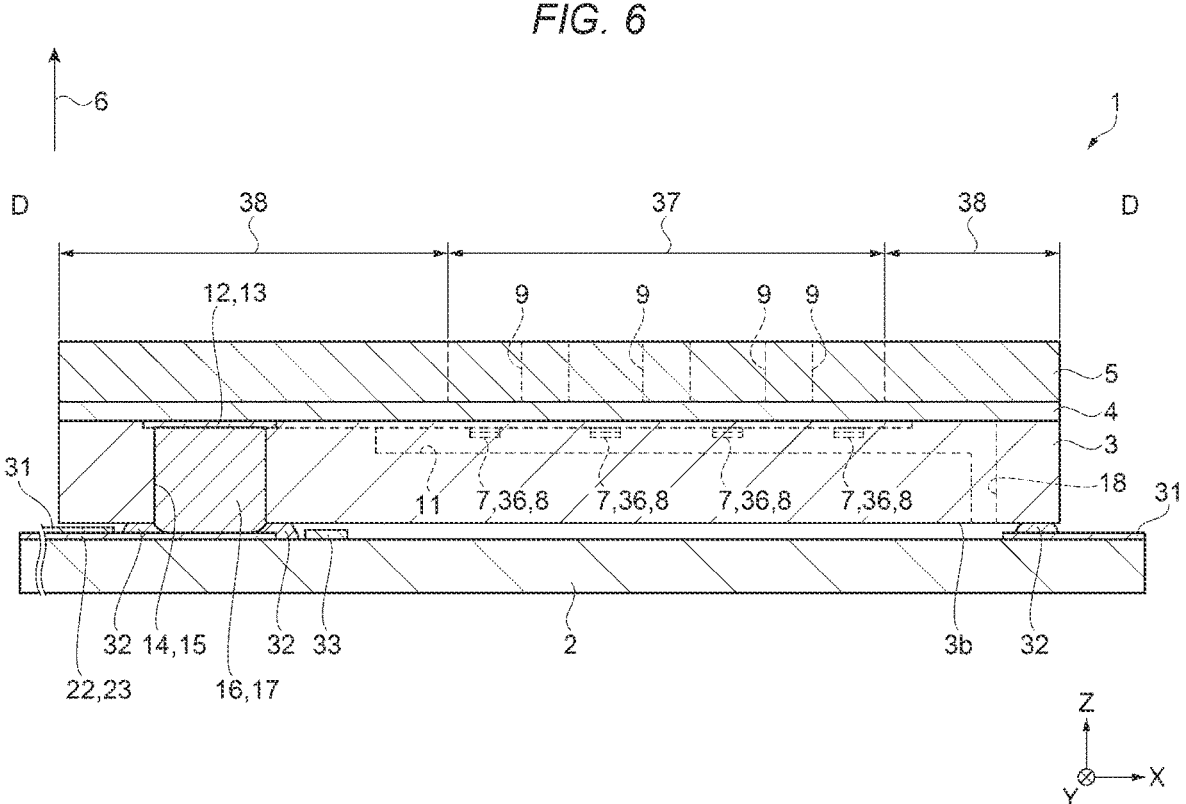
FIG. 6 is a schematic side sectional view showing the configuration of the piezoelectric device.

FIG. 6 shows a section along line DD in FIG. 1. As shown in FIG. 6, the second grooves 11 that enable the vibration of the first substrate 4 are placed between the first substrate 4 and the third substrate 3. The third substrate 3 includes the open hole 18 for communication between the second grooves 11 and the fourth surface 3b. The wall 33 is placed between the first through hole 14 and second through hole 15 and the open hole 18.

According to the configuration, the wall 33 suppresses the flow of the adhesives. Therefore, the flow of the adhesives does not reach the open hole 18 in the plan view of the piezoelectric device 1. When the open hole 18 is closed, the vibration of the first substrate 4 fluctuates the air pressure within the second grooves 11. Accordingly, the vibration of the first substrate 4 is suppressed and the resonance frequency changes. The piezoelectric device 1 of the embodiment may suppress the changes in resonance frequency due to entry of the adhesives into the open hole 18.

Figure 7:
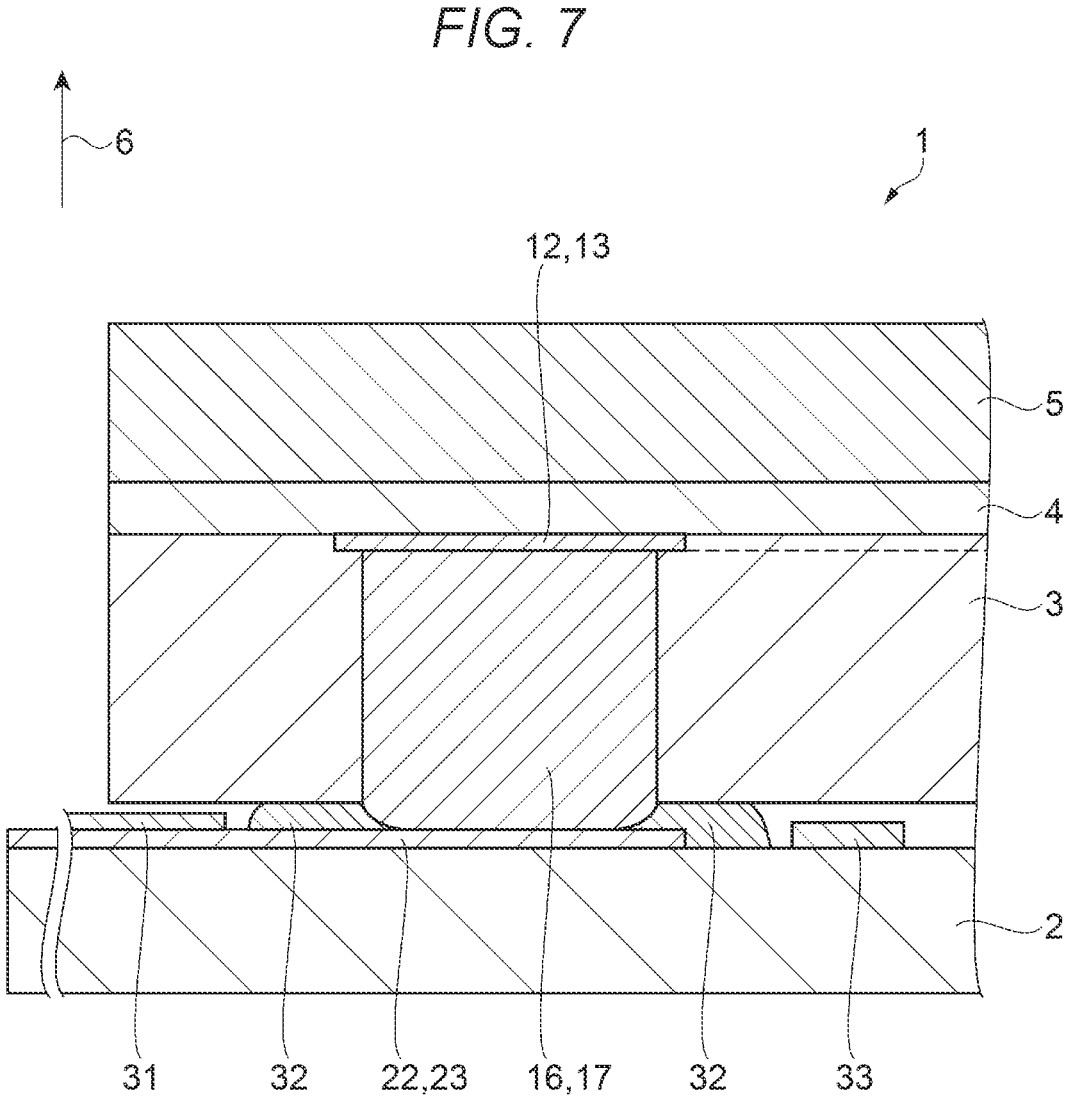
FIG. 7 is a schematic side sectional view of a main part for explanation of adhesives and a wall.
Figure 7:
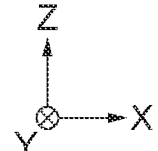

In the plan view in the first direction 6, the wall 33 is placed between the first through hole 14 and second through hole 15 and the element array 8. When the adhesives spread to the array area 37, the rigidity of the third substrate 3 becomes higher. Accordingly, the resonance frequency of the piezoelectric device 1 changes. As shown in FIG. 7, when the amounts of adhesives in the bonding portions 32 are larger, the adhesives reach the wall 33. Then, the wall 33 stops the flow of the adhesives. Then, the wall 33 suppresses the spread of the adhesives.

According to the configuration, the wall 33 suppresses the flow of the adhesives. Therefore, in the plan view in the first direction 6 in which the first substrate 4, the second substrate 2, and the third substrate 3 are stacked, the adhesives do not reach the array area 37 overlapping with the element array 8. Therefore, the changes in resonance frequency due to the adhesives may be suppressed in the piezoelectric device 1.

What is claimed is:

1. A piezoelectric device comprising:
a first substrate including a first surface on which a plurality of piezoelectric elements and a first electrode coupled to the piezoelectric elements are placed;
a second substrate including a second surface on which a second electrode coupled to a control circuit is placed;
a third substrate placed between the first substrate and the second substrate and including a third surface joined to the first surface and a fourth surface facing the second surface; and
a bonding portion bonding the second substrate and the third substrate by an adhesive, wherein
the third substrate includes a through hole penetrating from the third surface to the fourth surface and a third electrode provided in the through hole and coupled to the first electrode,
the adhesive surrounds and abuts a bottom outer peripheral part of the third electrode in a plan view,
the second electrode is coupled to the third electrode and electrically coupled to the first electrode via the third electrode, and
the second substrate includes a wall suppressing an outflow of the adhesive on the second surface facing the third substrate, and the wall is provided directly adjacent to the adhesive.

2. The piezoelectric device according to claim 1, wherein the plurality of piezoelectric elements form an element array in which the piezoelectric elements are arranged and placed, and the wall is placed between the through hole and the element array in the plan view from a stacking direction of the first substrate, the second substrate, and the third substrate.

3. The piezoelectric device according to claim 1, wherein a sealing space is placed between the first substrate and the third substrate,
the third substrate includes an open hole for communication between the sealing space and the fourth surface, and
the wall is placed between the through hole and the open hole.

4. The piezoelectric device according to claim 1, wherein the wall is a resist.

\* \* \* \* \*